(12) United States Patent
Wang et al.

(10) Patent No.: US 8,716,111 B2
(45) Date of Patent: May 6, 2014

(54) METHOD FOR MANUFACTURING TRENCH TYPE SUPERJUNCTION DEVICE AND TRENCH TYPE SUPERJUNCTION DEVICE

(75) Inventors: Fei Wang, Shanghai (CN); Shengan Xiao, Shanghai (CN); Wensheng Qian, Shanghai (CN)

(73) Assignee: Shanghai Hua Hong Electronics Co., Ltd., Shanghai (CN)

( * ) Notice: Subject to any disclaimer, the term of this patent is extended or adjusted under 35 U.S.C. 154(b) by 558 days.

(21) Appl. No.: 13/167,450

(22) Filed: Jun. 23, 2011

(65) Prior Publication Data

US 2011/0316121 A1 Dec. 29, 2011

(30) Foreign Application Priority Data

Jun. 24, 2010 (CN) .......................... 2010 1 0208746

(51) Int. Cl.
*H01L 21/20* (2006.01)
(52) U.S. Cl.
USPC .................. 438/478; 257/618; 257/E21.119; 257/E29.025

(58) Field of Classification Search
USPC ............ 438/478; 257/E21.119, E29.025, 618
See application file for complete search history.

(56) References Cited

U.S. PATENT DOCUMENTS

| | | | |
|---|---|---|---|
| 7,279,747 B2 | 10/2007 | Ninomiya | |
| 7,598,586 B2 | 10/2009 | Takaishi | |
| 2004/0129973 A1 | 7/2004 | Saito et al. | |
| 2007/0013000 A1 | 1/2007 | Shiraishi | |
| 2007/0114599 A1 | 5/2007 | Hshieh | |
| 2008/0197381 A1 | 8/2008 | Kawashima et al. | |
| 2011/0272762 A1* | 11/2011 | Booth, Jr. et al. | 257/347 |

* cited by examiner

*Primary Examiner* — Marc Armand
(74) *Attorney, Agent, or Firm* — Blakely Sokoloff Taylor & Zafman

(57) ABSTRACT

A method for manufacturing trench type super junction device is disclosed. The method includes the step of forming one or more P type implantation regions in the N type epitaxial layer below the bottom of each trench. By using this method, a super junction device having alternating P type and N type regions is produced, wherein the P type region is formed by P type silicon filled in the trench and P type implantation regions below the trench. The present invention can greatly improve the breakdown voltage of a super junction MOSFET.

18 Claims, 6 Drawing Sheets

US 8,716,111 B2

METHOD FOR MANUFACTURING TRENCH TYPE SUPERJUNCTION DEVICE AND TRENCH TYPE SUPERJUNCTION DEVICE

CROSS-REFERENCES TO RELATED APPLICATIONS

This application claims the priority of Chinese patent application number 201010208746.3, filed on Jun. 24, 2010, the entire contents of which are incorporated herein by reference.

FIELD OF THE INVENTION

The present invention relates to a trench type super junction device and its manufacturing method.

BACKGROUND

A super junction structure adopts an alternating P type and N type structure to replace the N drift region of a traditional VDMOS (Vertical Double-Diffused Metal Oxide Semiconductor). By using the well-known VDMOS manufacturing process, the super junction structure can be applied to the fabrication of a MOSFET so as to manufacture a super junction MOSFET. Since a super junction MOSFET adopts a low resistance epitaxial layer, a much lower on resistance can be achieved while maintaining a same breakdown voltage as a traditional VDMOS.

Generally, there are two ways to form an alternating P type and N type structure, namely by multiple epitaxial growths or by deep trench filling, wherein the method of deep trench filling has become a trend in development of super junction high voltage process due to its advantages of low cost and short process time. During the process of manufacturing a super junction device, the step of forming deep trenches is of vital importance as the depth and profile of the deep trench will influence the performance of the super junction device manufactured. Preferably, the deep trench should have a depth equal or nearly equal with the thickness of the epitaxial layer in which the deep trench is formed; besides, the profile of the deep trench should be vertical so as to make sure that the silicon filled in the deep trench has a good uniformity of concentration. After deep trench filling, CMP process is used to planarize the surface of the deep trenches, so that an alternating P type and N type structure is finished. The problem is that the process of deep trench etching and tilling is very difficult to control, and the manufacturing cost is very high.

BRIEF SUMMARY OF THE DISCLOSURE

An object of the present invention is to provide a trench type super junction device to improve the breakdown voltage of a high-voltage super junction MOSFET, and reduce the difficulty of the process of forming deep trenches.

In order to achieve the above object, the present invention provides a method for manufacturing trench type super junction device, which includes:

deposit a dielectric film on an N type epitaxial layer and form one or more trenches in the N type epitaxial layer by photolithograph and etch, wherein the N type epitaxial layer is formed on a substrate;

form one or more P type implantation regions below each trench by ion implantation;

fill the trenches with a P type semiconductor layer; and remove the P type semiconductor layer and the dielectric film above the N type epitaxial layer by chemical mechanical polishing and/or etch back process.

In order to achieve the above object, the present invention further provides a trench type super junction device manufactured by using the above-mentioned method, wherein the device comprises alternating P type and N type thin layers; the P type thin layer is formed by the P type semiconductor layer filled in the trench and the one or more P type implantation regions below the trench; the N type thin layer is formed by the N type epitaxial layer.

Those skilled in art shall understand that, in the above-mentioned method and device, all the N types can be replaced by P types, while all the P types are replaced by N types.

The present invention has the advantages that: the epitaxial layer between the bottom of the trench and the substrate is better depleted by adding one or more implantation regions below the trench, thus improving the breakdown voltage of the device; the difficulty of trench etching process is reduced as shallower trenches and slightly oblique trench profiles are acceptable in the present invention.

DETAILED DESCRIPTION

The present invention is further detailed by embodiments in combination with the drawings by taking a super junction NMOSFET as an example. Those skilled in the art shall understand that the same structure and manufacturing method can also be applied to a PMOSFET by replacing all the N-types with P-types and P-types with N-types.

Figure 1A:
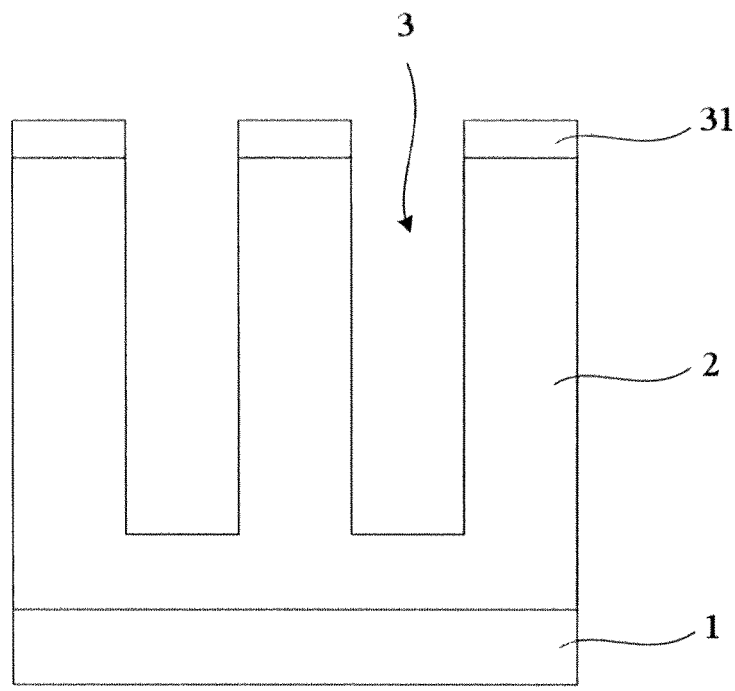
FIG. 1A~FIG. 1C are sectional views of the method for manufacturing trench type super junction device according to a first embodiment of the present invention.
Figure 1B:
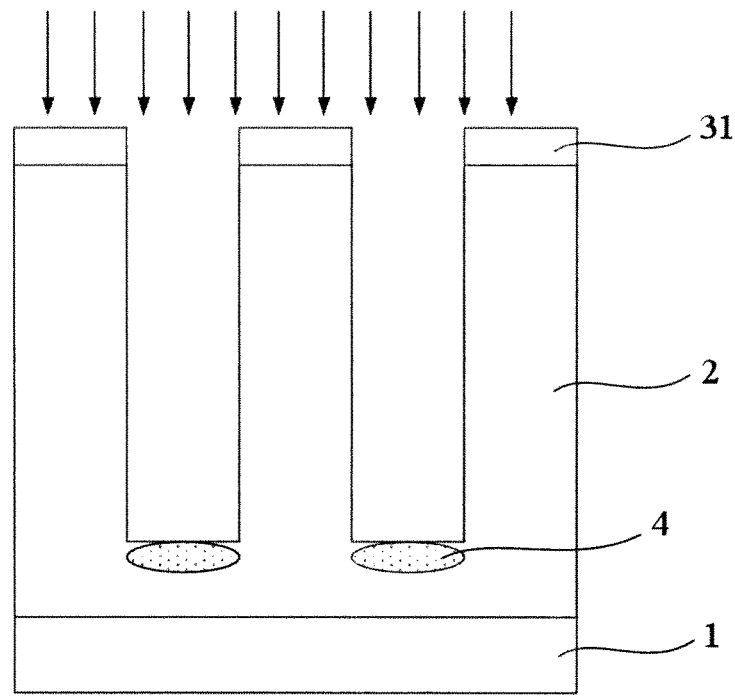
Figure 1C:
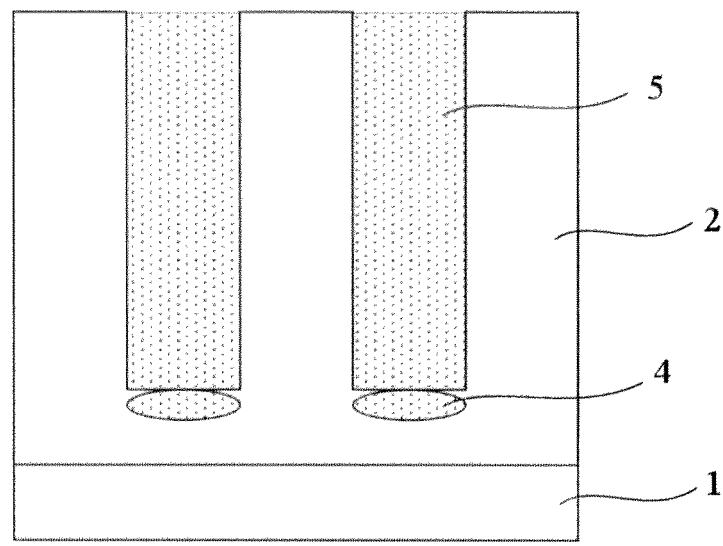

Please refer to FIGS. 1A~1C, the method for manufacturing trench type super junction device according to a first embodiment of the present invention includes the following steps:

Step 1, as shown in FIG. 1A, firstly form an N− epitaxial layer 2 on an N+ silicon substrate 1, wherein the Rs (Resistivity) of the N+ substrate 1 is in a range of 0.001~0.003 Ω·cm; the thickness and the Rs of the N− epitaxial layer 2 are determined according to the design requirement of the device. For a device of 600V BVDS (breakdown voltage), the Rs of the N− epitaxial layer 2 is 2~10 Ω·cm, and the thickness of the N− epitaxial layer 2 is 40~55 μm.

Then form a dielectric film 31 on the N− epitaxial layer 2, wherein the dielectric film 31 can be a silicon oxide film, and the dielectric film 31 can be used as hard mask during the subsequent process of trench etching and can also be used as stop layer during the subsequent process of chemical mechanical polishing.

Afterwards, form one or more trenches 3 in the N− epitaxial layer 2 by photolithograph and etch, wherein the trenches 3 may be formed in the N− epitaxial layer 2 without reaching the N+ substrate 1 (as shown in FIG. 1A); or the bottom of the trenches 3 may just reach the interface of the N− epitaxial layer 2 and the N+ substrate 1; or the trenches 3 may be etched through the N− epitaxial layer 2 into the N+ substrate 1. The depth of the trenches 3 is depended on the design requirement of the device.

The dielectric film 31 can be formed by thermal oxide process, or by chemical vapor deposition (CVD) process. During the process of trench etching, the dielectric film 31 can be used as hard mask, or a photoresist layer (not shown in the figure) may be used as hard mask by adopting the following steps after the formation of the dielectric film 31: deposit a photoresist layer on the dielectric film; form one or more etch windows in the photoresist layer by exposure and development; etch the dielectric film 31 and the N− epitaxial layer 2 in the etch windows by using the photoresist layer as hard mask to form trenches in the N− epitaxial layer. In the case of using the dielectric film 31 as hard mask, the remaining dielectric film after trench etching should preferably have a thickness of more than 1000 Å.

Step 2, as shown in FIG. 1B, form one or more P type implantation regions 4 below each of the trenches 3 by P type ion implantation. The P type impurity concentration is in a range of $1E15~10E15/cm^3$. In the first embodiment, only one P type implantation region 4 is formed below each trench 3, and the implantation region 4 is connected with the bottom of the trench 3.

Step 3, as shown in FIG. 1C, fill each trench with a P type semiconductor layer 5, wherein the P type semiconductor layer 5 is formed by a P type silicon layer (see FIG. 1C), or by a combination of a P type silicon layer 51 and a none-doped silicon layer 52 (see FIG. 5), or by a combination of a P type silicon layer 51 and a dielectric layer 53 (see FIG. 6); then remove the P type semiconductor layer 5 above the surface of the dielectric film 31 by CMP process or etch back process; afterwards, remove the dielectric film 31.

The impurities in the P type semiconductor layer 5 filled in the trenches and the impurities in the P type implantation regions 4 are used together to keep balance with the N type impurities in the N− epitaxial layer 2. Preferably, the total quantity of P type impurities in the implantation regions 4 and the P type semiconductor layer 5 shall he equal with the total quantity of N type impurities in the N− epitaxial layer 2 to get an ideal device character.

Figure 2:
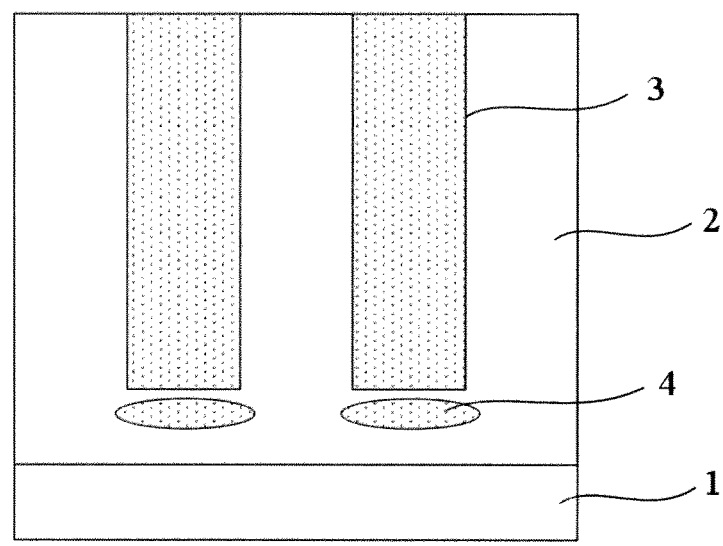
FIG. 2 is a schematic view of the impurities implanted below the bottom of the trenches according to a second embodiment of the present invention.

Please refer to FIG. 2, which shows a schematic view of the impurities implanted below the bottom of the trenches according to a second embodiment of the present invention. In the second embodiment, a P type implantation region 4 is formed below the bottom of each trench 3, while the P type implantation region 4 is not connected with the bottom of the trench 3. The structure as shown in FIG. 2 can be formed by performing a single step of P type ion implantation, while the depth of P type ion implantation is greater than the depth of the trenches 3.

Figure 3:
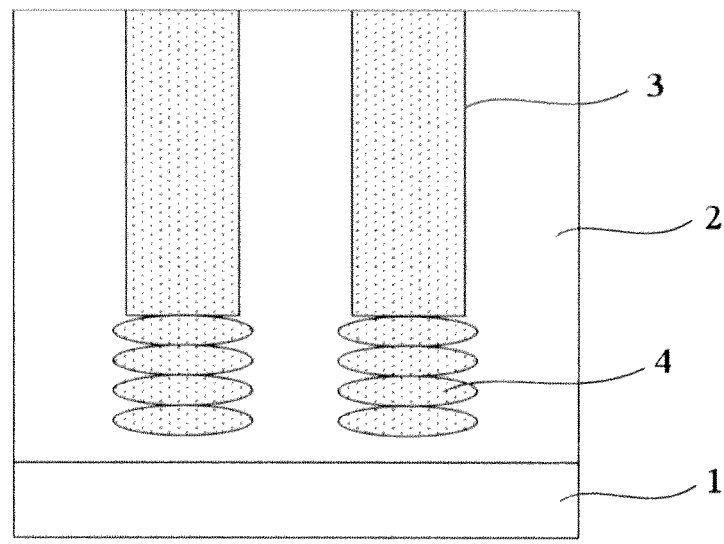
FIG. 3 is a schematic view of the impurities implanted below the bottom of the trenches according to a third embodiment of the present invention.

Please refer to FIG. 3, which shows a schematic view of the impurities implanted below the bottom of the trenches according to a third embodiment of the present invention. In the third embodiment, more than one P type implantation regions 4 are formed below the bottom of each trench 3; the P type implantation regions 4 are connected with one another, and the P type implantation region closest to the trench is connected with the bottom of the trench 3. The structure as shown in FIG. 3 can be formed by performing multiple steps of P type ion implantation with different implant energies. The implant energies are controlled such that the P type implantation regions 4 below each trench are consecutive in a vertical direction.

Figure 4:
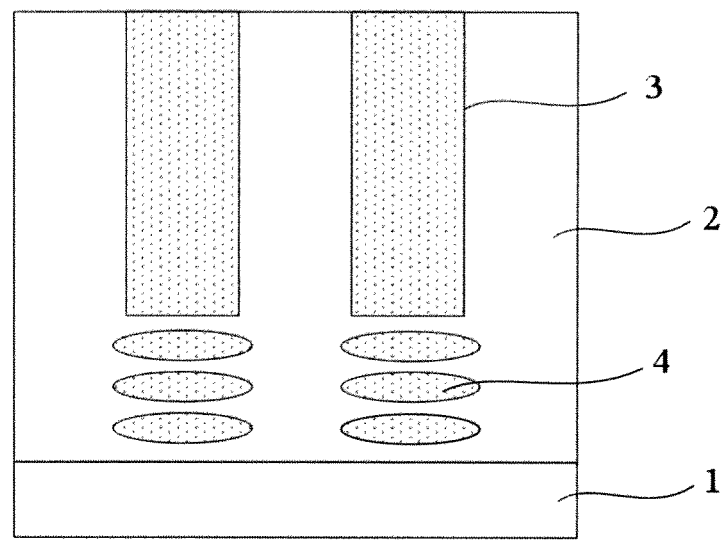
FIG. 4 is a schematic view of the impurities implanted below the bottom of the trenches according to a fourth embodiment of the present invention.

FIG. 4 shows a schematic view of the impurities implanted below the bottom of the trenches according to a fourth embodiment of the present invention. In FIG. 4, more than one P type implantation regions 4 are formed below the bottom of each trench 3; the P type implantation regions 4 are not connected with one another, and the P type implantation region closest to the trench is not connected with the bottom of the trench 3. The structure as shown in FIG. 4 can be formed by performing multiple steps of P type ion implantation with different implant energies. The implant energies are controlled such that the P type implantation regions 4 below each trench are not consecutive in the vertical direction.

In other embodiments, the one or more P type implantation regions 4 below each trench 3 (either consecutive or not) may connect or disconnect with the bottom of the trench 3, and may connect or disconnect with the N+ substrate 1. There is no limit to the distribution of P type impurities. As long as P type impurities exist between the bottom of the trench 3 and the N+ substrate 1, the breakdown voltage of the device is improved.

Figure 5:
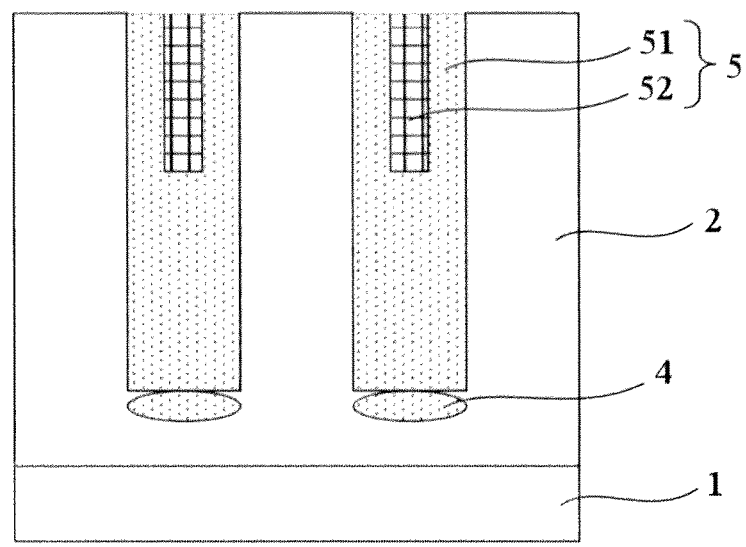
FIG. 5~FIG. 6 are schematic views of the materials filled in the trenches according to the present invention.
Figure 6:
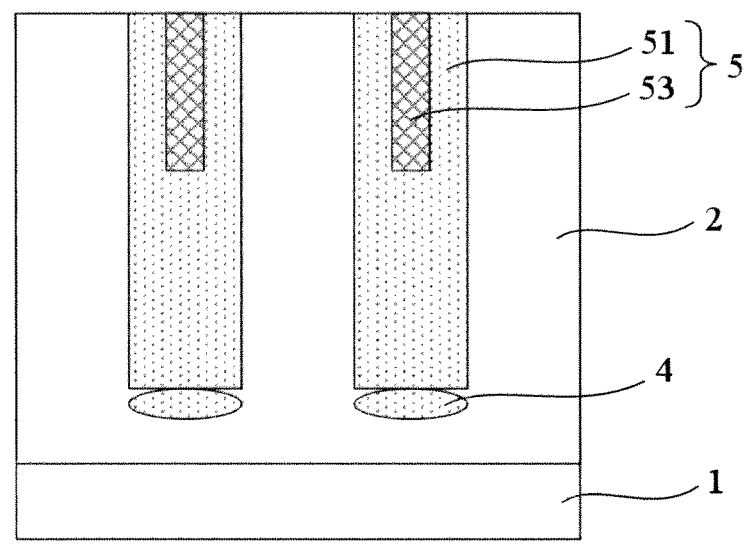

In step 3, namely the trench filling step, the P type silicon layer can be made of monocrystal silicon, polycrystal silicon or amorphous silicon; the growth temperature of P type silicon layer may be in a range of 650~1200. As shown in FIG. 5, when the P type semiconductor layer 5 filled in the trenches is formed by a combination of a P type silicon layer 51 and a none-doped silicon layer 52, the P type silicon layer 51 is deposited first, and followed by the none-doped silicon layer 52; the growth temperature of none-doped silicon layer 52 may be in a range of 510~650. As shown in FIG. 6, when the P type semiconductor layer 5 is formed by a combination of a P type silicon layer 51 and a dielectric layer 53, the dielectric layer 53 can be selected from non-doped silicon oxide layer or BPSG (borophosphosilicate glass). The dielectric layer 53 is selected according to the requirement of trench filling time and the permissibility of voids in the trench. BPSG is preferably used to achieve non-void trench filling. A P type silicon layer can be deposited in the trench first, and followed by a BPSG dielectric layer. Due to the reflow property of the BPSG layer, the voids in the trench can be easily filled during a thermal process.

Figure 7:
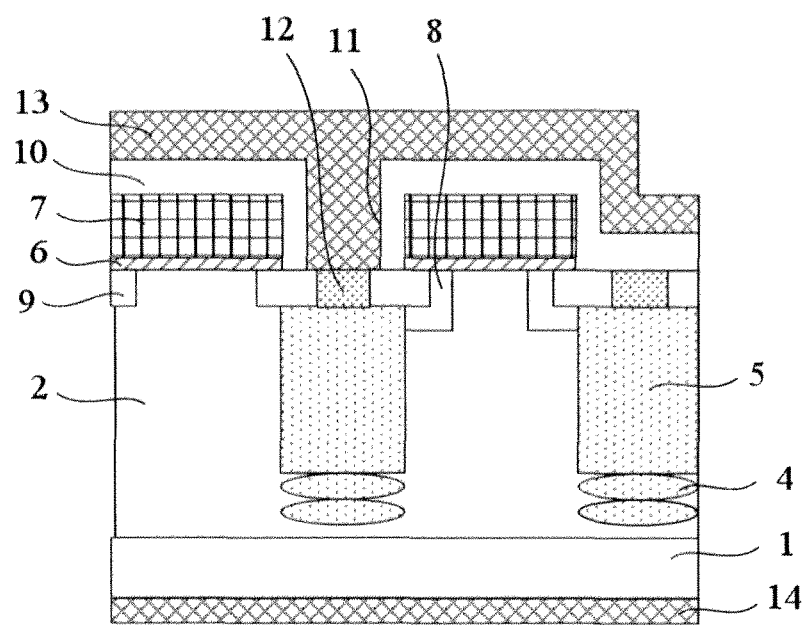
FIG. 7 is a sectional view of the trench type super junction device according to the present invention.

Afterwards, as shown in FIG. 7, by using conventional VDMOS (vertical double-diffusion metal-oxide-semiconductor) process, further steps are taken to produce a complete super junction NMOS device, including: form gate oxide layer 6 and polysilicon gates 7 on the P− epitaxial layer 2; form P wells 8 and N+ layers 9; form an inter layer dielectric film 10 on the polysilicon gates 7 to isolate polysilicon from metal; form contact holes 11 and P+ ohmic contact regions 12; form source metal electrodes 13 and gate polysilicon electrodes (not shown in the figure); form drain electrode (backside metal) 14 at the backside of the N+ substrate 1.

Figure 8:
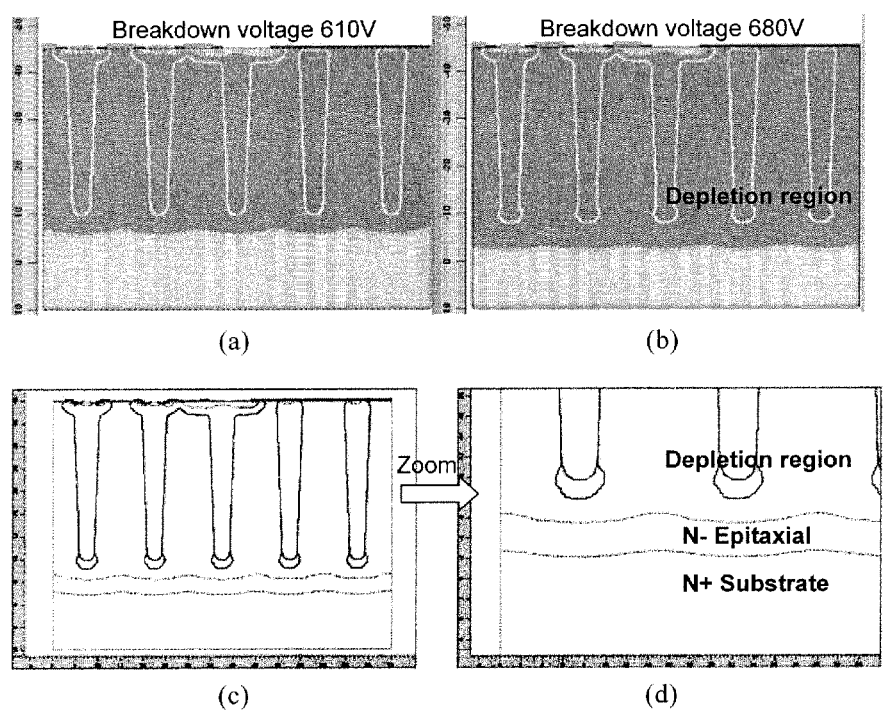
FIG. 8 shows simulation results of an NMOS according to the present invention.

The profile of the trenches according to the present invention can be vertical (90 degree) with regard to the surface of the substrate, or oblique (not strictly vertical). The bottom shape of the trenches can be flat or curved. Please refer to FIG. 8, a simulation is made to compare the breakdown voltages of a conventional NMOS having no impurities implanted below the trenches (see FIG. 8(a)) and a super junction NMOS with oblique trench profiles and P type implantation regions below the trenches according to the present invention (see FIG.

$8(b)$), wherein in both NMOS devices, the distance from the bottom of the trenches to the surface of the substrate is about 7~10 μm; the P type implantation regions are formed by using boron as impurity with an implant energy of 100 Kev and an implant dose of $5E12/cm^2$. The simulation result shows that the breakdown voltage of the conventional NMOS is only 610V while the breakdown voltage of the NMOS according to the present invention is 680V. As shown in FIGS. $8(c)$ and $8(d)$, it is obvious that when applying a high biased voltage to the NMOS device according to the present invention, the N− epitaxial layer between the trench bottom and the substrate surface is better depleted, and the electric field in the trench along the vertical direction is more uniformly distributed, thus having an improved breakdown voltage compared with the conventional device.

During the step of forming P type implantation regions, if multiple steps of implantation is taken, the implantation step with the highest implant energy can be performed first, the lowest last; or the lowest first and the highest last. The implant energy can be in a range of 0.5 kev to 10000 kev or even higher or lower. The implant energy is determined by the ability of the implant equipment. The higher the implant energy is, the greater depth the implantation region can reach, so that the trenches could be formed shallower, thus reducing the difficulty in trench etching process. In case that high implant energy is not available, the breakdown voltage of the NMOS may still be improved by implanting some P type impurities near the bottom of the trenches.

The impurities adopted in the P type implantation steps can be boron (B), BF2, or other impurities; the implant angle can be in a range of 0~10 degrees; the implant dose of the P type impurities can be in a range of $1E11~1E14/cm^2$, determined by device requirement. Preferably, the impurity concentration of the P type implantation regions is of the same order of magnitude with the impurity concentration of the P type semiconductor layer filled in the trenches.

Although the present invention has been described in considerable detail with reference to certain preferred embodiments thereof, the disclosure is not for limiting the scope of the invention. Persons having ordinary skill in the art may make various modifications and changes without departing from the scope and spirit of the invention. Therefore, the scope of the appended claims should not be limited to the description of the preferred embodiments described above.

What is claimed is:

1. A method for manufacturing trench type super junction device, comprising the following steps:
   depositing a dielectric film on a first type epitaxial layer and forming one or more trenches in the first type epitaxial layer by photolithograph and etch, wherein the first type epitaxial layer is formed on a substrate;
   forming one or ore second type implantation regions below each trench by ion implantation;
   filling the trenches with a second type semiconductor layer; and
   removing the second type semiconductor layer and the dielectric film above the first type epitaxial layer by chemical mechanical polishing and/or etch back process;
   wherein the first type is N type while the second type is P type, or the first type is P type while the second type is N type.

2. The method as claimed in claim 1, wherein:
   the one or more second type implantation regions are formed between the bottom of each trench and the substrate;
   the second type implantation region may connect or disconnect with the bottom of the trench;
   the second type implantation region may connect or disconnect with the substrate.

3. The method as claimed in claim 1, wherein the second type semiconductor layer is made of a second type silicon layer, or made of a second type silicon layer and a non-doped silicon layer formed in sequence, or made of a second type silicon layer and a dielectric layer formed in sequence.

4. The method as claimed in claim 1, wherein the trenches may have a vertical profile or an oblique profile; the trenches may have a flat bottom shape or a curved bottom shape.

5. The method as claimed in claim 1, wherein the dielectric film is a silicon oxide film formed by thermal oxidation or chemical vapor deposition process.

6. A trench type super junction device, formed by using the method as claimed in claim 1, wherein the device comprises alternating first type and second type thin layers, the first type thin layer being formed by the first type epitaxial layer, the second type thin layer being formed by the second type semiconductor layer filled in the trench and the one or more second type implantation regions below the corresponding trench.

7. The method as claimed in claim 2, wherein a single step of ion implantation by using second type impurities is performed to form a second type implantation region below each trench.

8. The method as claimed in claim 2, wherein multiple steps of ion implantation by using second type impurities are performed to form more than one second type implantation regions below each trench.

9. The method as claimed in claim 2, wherein a total quantity of second type impurities in the second type semiconductor layer and the second type implantation regions is equal with a total quantity of first type impurities in the first type epitaxial layer.

10. The method as claimed in claim 2, wherein the second type implantation regions have an impurity concentration of the same order of magnitude with an impurity concentration of the second type semiconductor layer.

11. A trench type super junction device, formed by using the method as claimed in claim 2, wherein the device comprises alternating first type and second type thin layers, the first type thin layer being formed by the first type epitaxial layer, the second type thin layer being formed by the second type semiconductor layer filled in the trench and the one or more second type implantation regions below the corresponding trench.

12. The method as claimed in claim 3, wherein the second type silicon layer is made of monocrystal silicon, polycrystal silicon or amorphous silicon, the second type silicon layer being formed under a temperature of 650~1200 degrees.

13. The method as claimed in claim 3, wherein the non-doped silicon layer is formed under a temperature of 510~650 degrees.

14. The method as claimed in claim 3, wherein the dielectric layer is non-doped silicon oxide or BPSG.

15. The method as claimed in claim 7, wherein the single step of ion implantation has an implant energy of 0.5 Kev~1000 Kev, an implant dose of $1E11~1E14/cm^2$, and an implant angle of 0~10 degrees.

16. The method as claimed in claim 8, wherein the multiple steps of ion implantation use different implant energies to form more than one second type implantation regions along a vertical direction, the second type implantation regions being connected to one another or being separate from one another.

17. The method as claimed in claim 8, wherein:
the implant energies of the multiple steps of ion implantation range from 0.5 Kev to 1000 Kev;
the step of ion implantation with the highest implant energy is performed first and the step of ion implantation with the lowest implant energy is performed last, or the step of ion implantation with the lowest implant energy is performed first and the step of ion implantation with the highest implant energy is performed last.

18. The method as claimed in claim 8, wherein the multiple steps of ion implantation have an implant dose of $1E11 \sim 1E14/cm^2$, and an implant angle of 0~10 degrees.

* * * * *